United States Patent
Lin et al.

(10) Patent No.: US 12,500,561 B2
(45) Date of Patent: Dec. 16, 2025

(54) HIGH-SPEED LOW-DISTORTION ENVELOPE DETECTOR AND METHOD THEREOF

(71) Applicant: Realtek Semiconductor Corp., Hsinchu (TW)

(72) Inventors: Chia-Liang (Leon) Lin, Fremont, CA (US); Ting-Hsu Chien, San Jose, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 546 days.

(21) Appl. No.: 18/183,984

(22) Filed: Mar. 15, 2023

(65) Prior Publication Data

US 2024/0313726 A1  Sep. 19, 2024

(51) Int. Cl.
*H03F 3/45* (2006.01)
*H03F 1/02* (2006.01)
*H03F 3/50* (2006.01)

(52) U.S. Cl.
CPC ........... *H03F 3/505* (2013.01); *H03F 1/0222* (2013.01); *H03F 3/45183* (2013.01); *H03F 3/45273* (2013.01)

(58) Field of Classification Search
CPC .... H03F 3/505; H03F 1/0222; H03F 3/45183; H03F 3/45273; G01R 19/04; H04L 27/38
USPC ........................................................ 330/253
See application file for complete search history.

(56) References Cited

U.S. PATENT DOCUMENTS

| | | | |
|---|---|---|---|
| 8,497,711 B2 * | 7/2013 | Hsieh ................. | H04L 25/0292 327/72 |
| 2012/0083205 A1 * | 4/2012 | Marcu ................. | G06K 7/0008 455/41.1 |

* cited by examiner

*Primary Examiner* — Andrea Lindgren Baltzell
*Assistant Examiner* — Khiem D Nguyen
(74) *Attorney, Agent, or Firm* — McClure, Qualey & Rodack, LLP

(57) ABSTRACT

A method of envelope detection operates by receiving a RF (radio frequency) signal having a first voltage at a first node and a second voltage at a second node; using a common-mode source-follower (CMSF) having a first source follower and a second source follower connected in parallel and configured to receive the first voltage and the second voltage, respectively, and jointly output a first current to a third node in accordance with a sum of a second current and a third current received via a fourth node; establishing a first negative feedback control loop by converting the first current into the third current using a current-controlled current source (CCCS); and establishing a second negative feedback control loop by converting a drain voltage at the third node into the second current using a voltage-controlled current source (VCCS).

20 Claims, 4 Drawing Sheets

HIGH-SPEED LOW-DISTORTION ENVELOPE DETECTOR AND METHOD THEREOF

BACKGROUND OF THE DISCLOSURE

Field of the Disclosure

The present disclosure generally relates to envelope detectors and more particularly to high-speed, low-distortion envelope detectors having reduced sensitivity to temperature and manufacturing process.

Description of Related Art

An RF (radio frequency) signal S(t) can be mathematically modeled by the following equation:

$$S(t) = A(t) \cdot \sin(2\pi f_C t + \varphi(t)) \quad (1)$$

Here, t is a time variable, A(t) is an envelope signal, $f_C$ is a carrier frequency, and $\varphi(t)$ is a phase signal. The envelope signal and the phase signal can be used to carry information. The information embedded in the envelope signal can be retrieved using an envelope detector. As shown in FIG. 1, a prior art envelope detector 100, which receives an RF signal and generates a detected envelope signal in accordance with a DC (direct current) bias voltage, comprises: a diode 101, two capacitors 102 and 104, and two resistors 103 and 105. The envelope detector 100 further comprises an output driver 106 configured to receive the detected envelope signal and output an output signal to be used by a subsequent circuit. The envelope detector 100 is well known in the prior art and thus not explained in detail. Note that capacitor 104, which provides AC (alternate current) coupling, and resistor 105, which establishes a DC level for the RF signal after the AC coupling, are not needed if the RF signal already has a proper DC level. A drawback of the envelope detector 100 is distortion, which is due to a threshold voltage and crossover characteristics of the diode 101. Although the issue can be alleviated by properly choosing a value for the DC bias voltage, the value might be highly dependent on temperature and manufacturing process, and the improvement is limited due to the inherent crossover characteristics of the diode 101. Another factor to consider is speed, which is gauged by a time delay between the envelope signal embedded in the RF signal and the output signal. Both the diode 101 and the output driver 106 contribute to the time delay of the envelope detector 100.

What is desired is an envelope detector that can be high-speed, low-distortion, and insensitive to temperature and manufacturing process.

BRIEF DESCRIPTION OF THIS DISCLOSURE

An objective of this disclosure is to alleviate temperature and manufacturing process dependency of an envelope detector.

Another objective of this disclosure is to alleviate a crossover distortion of an envelope detector.

Another objective of this disclosure is to allow an envelope detector to have a high speed.

In an embodiment, an envelope detector comprises: a common-mode source follower (CMSF) comprising a first source follower and a second source follower connected in parallel and configured to receive a RF (radio frequency) signal comprising a first voltage at a first node and a second voltage at a second node, respectively, and jointly output a first current to a third node in accordance with a sum of a second current and a third current received via a fourth node; a current-controlled current source (CCCS) configured to receive the first current and output the third current; and a voltage-controlled current source (VCCS) configured to output the second current in accordance with a bias voltage and a drain voltage of the CMSF at the third node.

In an embodiment, a method of envelope detection comprises: receiving a RF (radio frequency) signal comprising a first voltage at a first node and a second voltage at a second node; using a common-mode source-follower (CMSF) comprising a first source follower and a second source follower connected in parallel and configured to receive the first voltage and the second voltage, respectively, and jointly output a first current to a third node in accordance with a sum of a second current and a third current received via a fourth node; establishing a first negative feedback control loop by converting the first current into the third current using a current-controlled current source (CCCS); and establishing a second negative feedback control loop by converting a drain voltage at the third node into the second current using a voltage-controlled current source (VCCS).

DETAILED DESCRIPTION OF THIS DISCLOSURE

Figure 1:
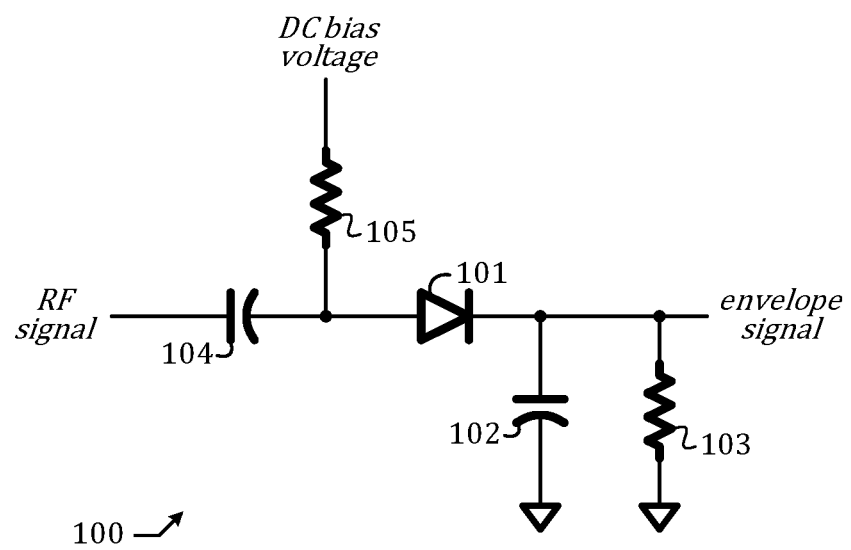
FIG. 1 shows a schematic diagram of a prior art envelope detector.

The present disclosure is directed to envelope detection. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "circuit node," "signal," "power supply," "ground," "bias voltage," "DC (direct current)," "AC (alternate current)," "NMOSFET (n-channel metal oxide semiconductor field effect transistor)," "PMOSFET (p-channel metal oxide semiconductor field effect transistor)," "current source," "operational amplifier," "voltage-controlled current source," "current-controlled current source," and "source follower." Terms like these are used in a context of microelectronics, and the associated concepts are apparent to those of ordinary skills in the art and thus will not be explained in detail in this disclosure.

Those of ordinary skill in the art can recognize a resistor symbol, a capacitor symbol, and a MOSFET (metal-oxide semiconductor field effect transistor) symbol, for both PMOSFET and NMOSFET, and can identify a "source" terminal, a "gate" terminal, and a "drain" terminal of a MOSFET. Those of ordinary skills in the art can read schematics of a circuit comprising resistors, capacitors, NMOSFET, and PMOSFET, and do not need a verbose description about how one transistor, resistor, or capacitor connects with another in the schematics.

This present disclosure is disclosed in terms of an engineering sense. For instance, regarding two variables X and Y, when it is said that "X is equal to Y," it means that "X is approximately equal to Y," i.e., "a difference between X and Y is smaller than a specified engineering tolerance." When it is said that "X is zero," it means that "X is approximately zero," i.e., "X is smaller than a specified engineering tolerance." When it is said that "X is substantially smaller than Y," it means that "X is negligible with respect to Y," i.e., "a ratio between X and Y is smaller than an engineering tolerance and therefore X is negligible when compared to Y."

Throughout this disclosure, "$V_{DD}$" denotes a power supply node, and "$V_{SS}$" denotes a ground node. Note that a ground node is a node at which a voltage level is substantially zero, and a power supply node is a node at which a voltage level is substantially stationary and higher than zero.

A circuit is a collection of a transistor, a capacitor, a resistor, and/or other electronic devices inter-connected in a certain manner to embody a certain function.

A network is a circuit or a collection of circuits configured to embody a certain function.

In this present disclosure, a "circuit node" is simply referred to as a "node" for short, as the meaning is clear from a context of microelectronics won't cause confusion.

In this present disclosure, a signal is a voltage of a variable level that can vary with time. A (voltage) level of a signal at a moment represents a state of the signal at that moment. A differential signal, or a signal in a differential embodiment, comprises a first voltage and a second voltage, and a difference in level between the first voltage and the second voltage represents a state of the differential signal.

Figure 2:
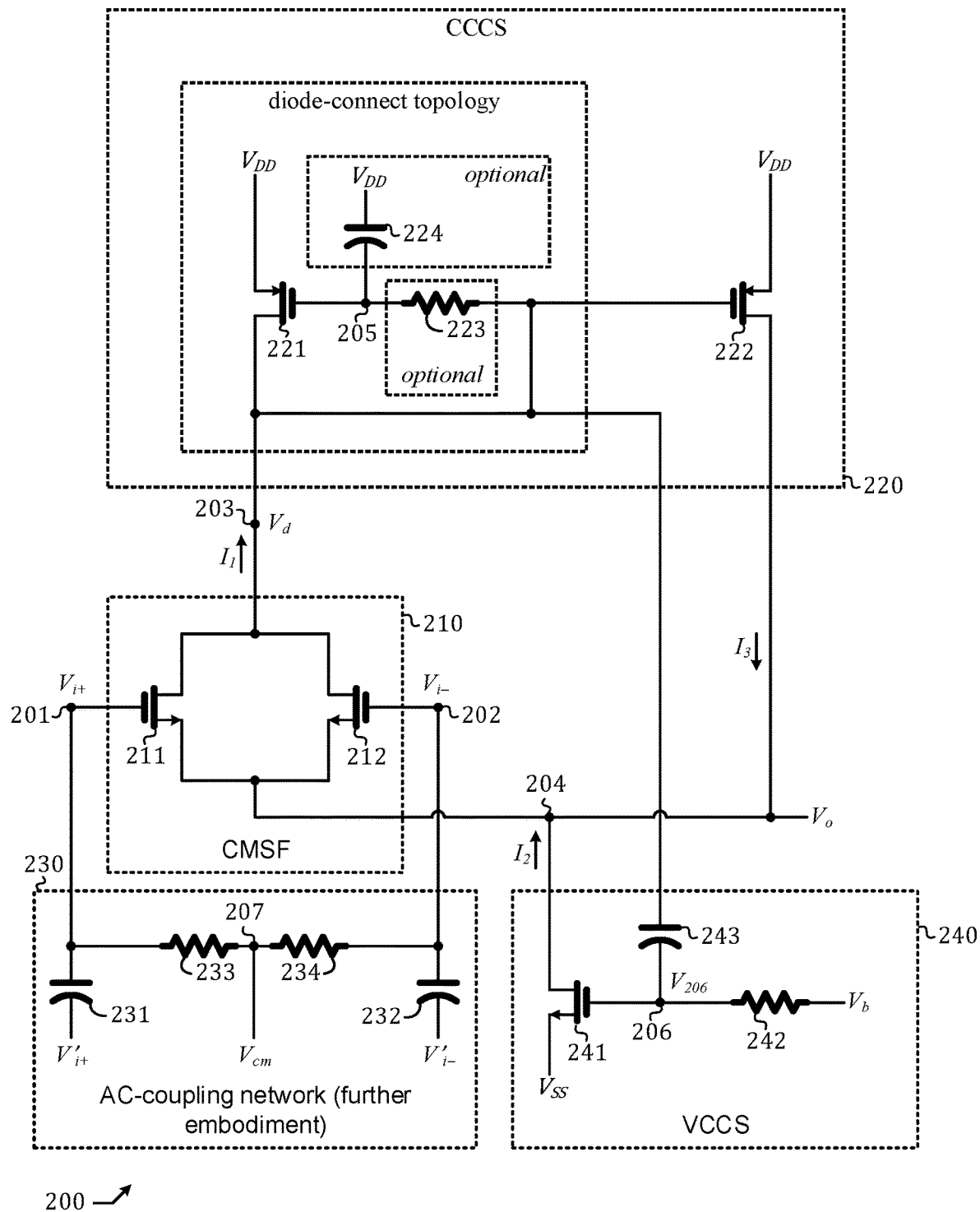
FIG. 2 shows a schematic diagram of an envelope detector in accordance with an embodiment of the present disclosure.

A schematic diagram of an envelope detector 200 in accordance with an embodiment of the present disclosure is shown in FIG. 2. Envelope detector 200 receives a RF (radio frequency) signal that in a differential signal embodiment comprises two voltages $V_{i+}$ and $V_{i-}$, and outputs an output voltage $V_o$, which is a detected envelope signal of the RF signal. Envelope detector 200 comprises: a common-mode source follower (CMSF) 210 configured to receive $V_{i+}$ and $V_{i-}$ at a first node 201 and a second node 202, respectively, and outputs a first current $I_1$ to a third node 203 in accordance with a sum of a second current $I_2$ and a third current $I_3$ received via a fourth node 204; a current-controlled current source (CCCS) 220 configured to receive the first current $I_1$ from the third node 203 and output the third current $I_3$ to the fourth node 204; and a voltage-controlled current source (VCCS) 240 configured to output the second current $I_2$ in accordance with a bias voltage $V_b$ and a drain voltage $V_d$ of the CMSF 210 at the third node 203.

$V_{i+}$ and $V_{i-}$ jointly embody a RF signal. In an embodiment, $V_{i+}$ and $V_{i-}$ are complementary, i.e., when $V_{i+}$ rises/falls by an amount, $V_{i-}$ will fall/rise by the same account. When $V_{i+}$ reaches a peak, $V_{i-}$ will reach a valley, and vice versa. An envelope of the RF signal is defined by a peak of $V_{i+}$ or a peak of $V_{i-}$, whichever is higher, and detected and represented by $V_o$, which is a voltage at the fourth node 204.

CMSF 210 comprises NMOSFET 211 and NMOSFET 212 connected in parallel and configured to receive $V_{i+}$ and $V_{i-}$, respectively, and jointly output $I_1$ in accordance with a sum of $I_2$ and $I_3$. NMOSFET 211 and NMOSFET 212 both function as a source follower, wherein a source voltage follows a gate voltage. Since NMOSFET 211 and NMOSFET 212 share the same source voltage (which is $V_o$) at the fourth node 204, whichever receives a higher gate voltage will dominate a voltage level of $V_o$. As a result, $V_o$ will follow a higher voltage between $V_{i+}$ and $V_{i-}$, and a function of envelope detection is thus fulfilled.

A current-controlled current source (CCCS) is a circuit that converts an input current into an output current that is approximately proportional to the input current. CCCS 220 receives $I_1$ (which is an output of CMSF 210) and outputs $I_3$ (which is a part of a biasing current of CMSF 210 that is received via the fourth node 204) in an inverting manner, such that an increase (decrease) of $I_1$ leads to a decrease (increase) of $I_3$, thus causing a decrease (increase) of $I_1$. A first negative feedback control loop is thus formed; the first negative feedback control loop can suppress a distortion of $V_o$, thus allowing the envelope detector 200 to have low distortion.

As shown in FIG. 2, CCCS 220 comprises PMOSFET 221 and PMOSFET 222. PMOSFET 221 is configured in a diode-connect topology, wherein a drain is connected to a gate, to convert $I_1$ into $V_d$, which is a drain voltage of CMSF 210 at the third node 203. Due to the diode-connect topology, $V_d$ is also a gate voltage of PMOSFET 221. PMOSFET 222 and PMOSFET 211 have the same gate voltage $V_d$ and the same source voltage $V_{DD}$ and thus the same gate-to-source voltage, and a current-mirroring function is established, so that $I_3$ is approximately proportional to $I_1$ but of opposite sign. A current-controlled current source function is thus fulfilled. In an optional embodiment, a gate resistor 223 is inserted between the third node 203 and a fifth node 205, which connects to the gate of PMOSFET 221. Gate resistor 223 can cause the PMOSFET 221 to behave as an active inductor, compensating a parasitic capacitor at the third node 203 and speeding up CCCS 220. In a further optional embodiment, CCCS 220 further comprises a capacitor 224 inserted between the fifth node 205 and the power supply node $V_{DD}$. Capacitor 224 can further enhance the active inductor behavior and speed up CCCS 220. That a diode-connected MOST with a gate resistor and a gate-to-source capacitor can form an active inductor is well known in the prior art and thus not further explained in detail.

A voltage controlled current source (VCCS) is a voltage-to-current conversion circuit configured to output an output current in accordance with a control voltage. VCCS 240 comprises NMOSFET 241, resistor 242, and capacitor 243. NMOSFET 241 outputs $I_2$ in accordance with a control voltage $V_{206}$ at a sixth node 206. The control voltage $V_{206}$ comprises a static component received from $V_b$ via resistor 242 and a dynamic component received from $V_d$ via capacitor 243. A DC (direct-current) component of $I_2$ is determined by $V_b$, while an AC (alternate current) component of $I_2$ is determined by $V_d$. When $V_d$ rises (falls), $V_{206}$ rises (falls), and consequently 12 and $I_1$ decrease (increase), causing $V_d$ to fall (rise). A second negative feedback control loop is thus formed, further alleviating a distortion of $V_o$.

In a further embodiment, the envelope detector 200 further comprises an AC (alternate current) coupling network 230 configured to couple two voltages $V'_{i+}$ and $V'_{i-}$ into $V_{i+}$ and $V_{i-}$, respectively, wherein $V'_{i+}$ and $V'_{i-}$ jointly embody an incoming signal in a differential embodiment. AC coupling network 230 comprising two capacitors 231 and 232 configured to provide AC (alternate current) coupling from $V'_{i+}$ and $V'_{i-}$ to $V_{i+}$ and $V_{i-}$, respectively, and two resistors 233 and 234 configured to provide DC (direct current) coupling from a common-mode voltage $V_{cm}$ to $V_{i+}$ and $V_{i-}$, respectively. In an embodiment, a capacitance of capacitors 231 and 232 is substantially greater than a parasitic capacitance (not shown in figure but the concept is well understood by those of ordinary skill in the art) at nodes 201 and 202; this way, the AC coupling function of capacitors 231 and 232 can be effective. In an embodiment, a resistance of resistors 233 and 234 is substantially larger than an impedance of capacitors 231 and 232 at a frequency of the incoming signal; this way, resistors 233 and 234 can make a DC value of $V_{i+}$ and $V_{i-}$ be equal to $V_{cm}$ without introducing an appreciable AC signal loss of the incoming signal, and consequently an amplitude of $V'_{i+}$ can be approximately equal to an amplitude of $V_{i+}$, while an amplitude of $V_{i-}$ can be approximately equal to an amplitude of $V'_{i-}$.

Figure 3:
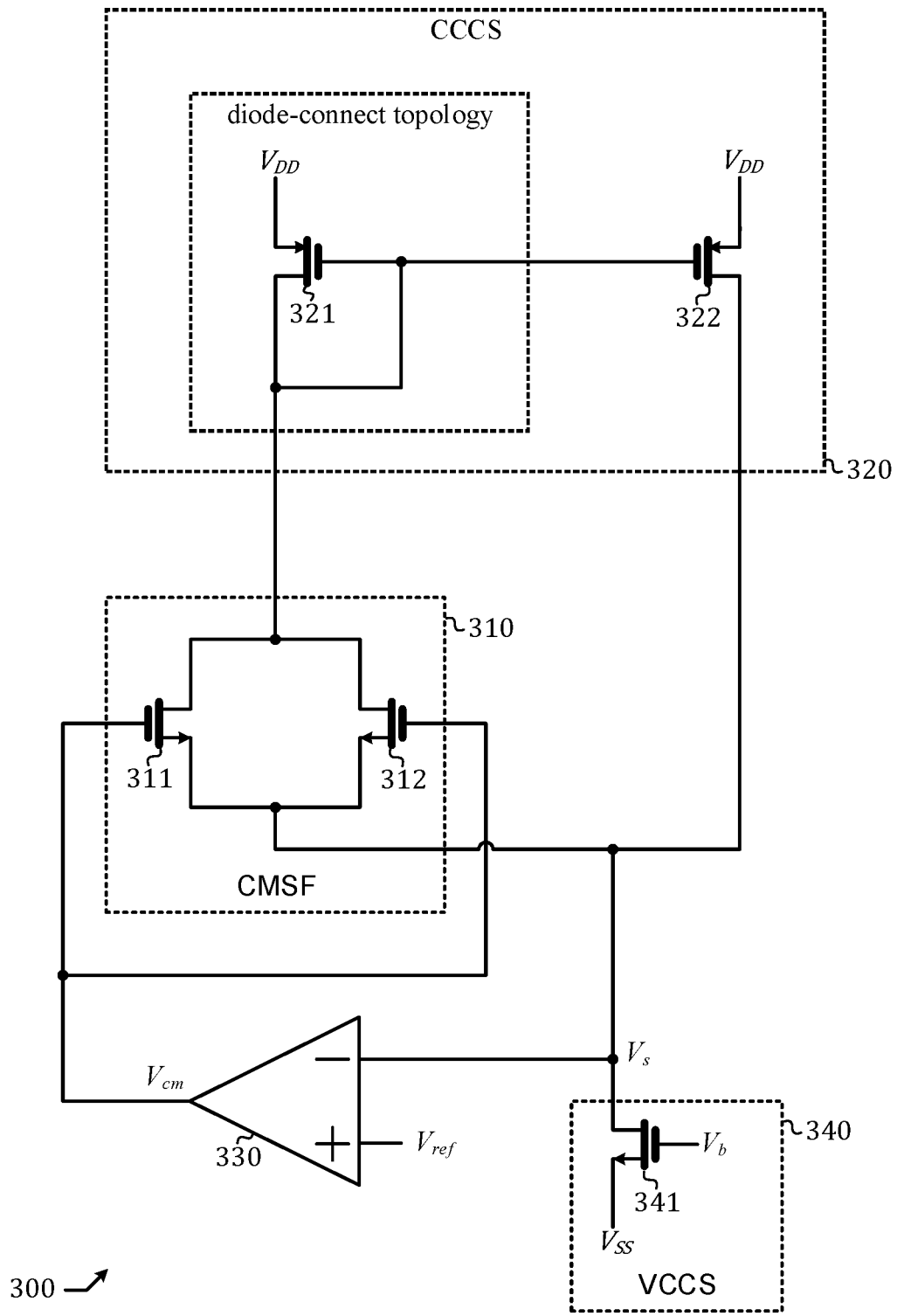
FIG. 3 shows a schematic diagram of a bias generation network in accordance with an embodiment of the present disclosure.

In a further embodiment, a bias generation network 300 is used to generate the common-mode voltage $V_{cm}$. As shown in FIG. 3, bias generation network 300 comprises CMSF 310 (comprising NMOSFET 311 and NMOSFET 312), CCCS 320 (comprising PMOSFET 321 configured in a diode-connect topology and PMOSFET 322), VCCS 340 (comprising NMOSFET 341), and an operational amplifier 330. In terms of circuit topology, CMSF 310 is the same as CMSF 210, CCCS 320 is the same as CCCS 220 (except that resistor 223 and capacitor 224 are removed, i.e., are replaced by a short circuit and an open circuit, respectively), VCCS 340 is the same as VCCS 240 (except that capacitor 243 and resistor 242 are removed, i.e., are replaced by an open circuit and a short circuit, respectively). Operational amplifier 330 outputs $V_{cm}$ in accordance with a difference between a reference voltage $V_{ref}$ and a source voltage Vs of CMSF 310. Operational amplifier 330 and CMSF 310 form a third negative feedback control loop to make Vs approximately equal to $V_{ref}$. In an embodiment, CMSF 310, CCCS 320, and VCCS 340 are a replica of CMSF 210, CCCS 220, and VCCS 240 (except the removal of resistors and capacitors). In this case, a DC level of $V_o$ is approximately equal to Vs and thus approximately equal to $V_{ref}$ in the absence of incoming signal embodied by $V'_{i+}$ and $V'_{i-}$. This way, the DC level of $V_o$ can be controlled. Operational amplifiers are well known in the prior art and thus not described in detail. Operational amplifier 330 can be implemented using a variety of suitable circuits known in the prior art at a discretion of a circuit designer.

Envelope detector 200 offers certain advantages over the prior art envelope detector 100. First, it is highly insensitive to temperature and manufacturing process. When temperature and manufacturing process vary, characteristics of CMSF 210, CCCS 220, and VCCS 240 may vary. However, the first negative feedback control loop formed by CCCS 220 and the second negative feedback control loop formed by VCCS 240 can both help to improve an accuracy of envelope detection, provided their loop gains remain sufficiently high over temperature and manufacturing process variation. If a loop gain of a negative feedback control loop is, for instance, 40 dB, an error of an output of the loop gain may be typically approximately 1%. If the loop gain varies between 34 dB to 46 dB, for instance, due to temperature and manufacturing process variation, the error typically may vary approximately between 0.5% and 2%, which is still small. In other words, the negative feedback control loop can still ensure high accuracy and low distortion of $V_o$ despite temperature and manufacturing process variation. Second, crossover distortion can be eliminated, since at least one of $V_{i+}$ and $V_{i-}$ can cause CMSF 210 to remain in an on-state, and a cross-over between an on-state and an off-state is avoided. Third, a high-speed envelope detection can be fulfilled. This is because CMSF 210 is a very high-speed circuit, wherein a delay is merely between a gate and a source of NMOSFET 211 and NMOSFET 212. The second negative feedback control loop formed by VCCS 240 is fast, because it only involves a gate-to-drain delay of NMOSFET 241. The first negative feedback control loop formed by CCCS 220 is not as fast, because it involves a current to voltage conversion of PMOSFET 221 and a gate-to-drain delay of PMOSFET 222. However, the optional resistor 223 and the optional capacitor 224 can speed up the current-to-voltage conversion of PMOSFET 221, thus speeding up the first negative feedback control loop.

Figure 4:
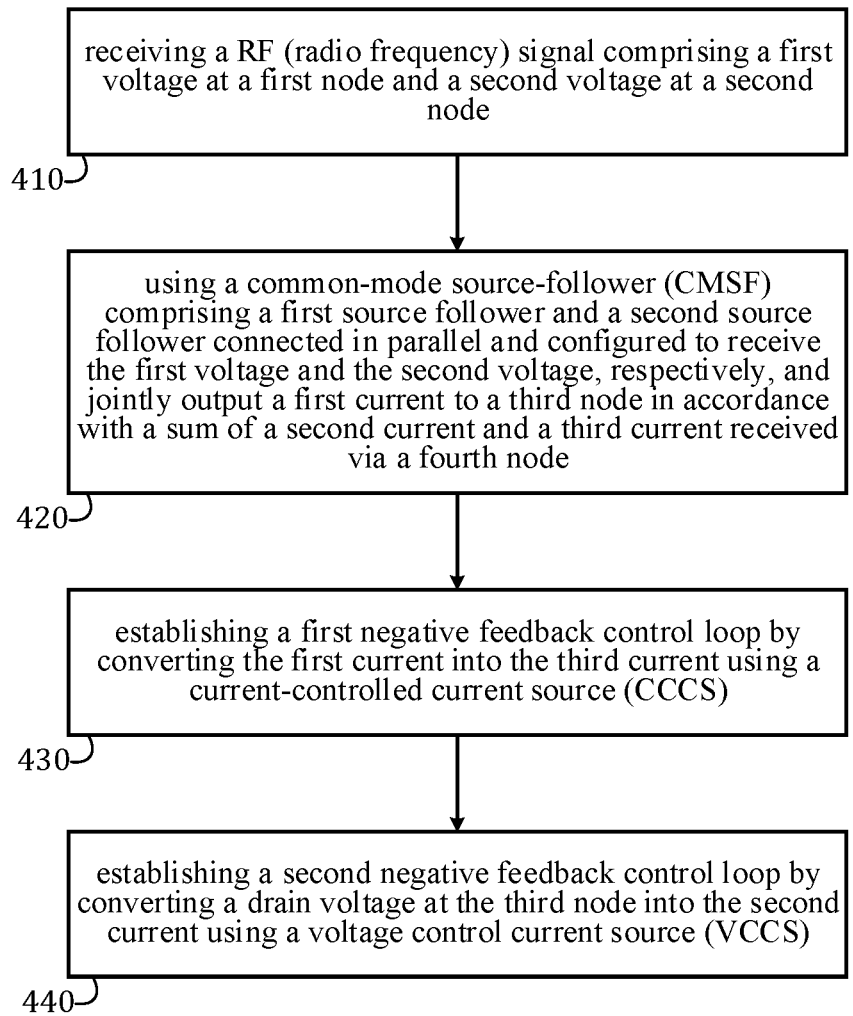
FIG. 4 shows a flow diagram of envelope detection in accordance with an embodiment of the present disclosure.

As illustrated by a flow diagram shown in FIG. 4, a method of envelope detection in accordance with an embodiment of the present disclosure comprises: (step 410) receiving a RF (radio frequency) signal comprising a first voltage at a first node and a second voltage at a second node; (step 420) using a common-mode source-follower (CMSF) comprising a first source follower and a second source follower connected in parallel and configured to receive the first voltage and the second voltage, respectively, and jointly output a first current to a third node in accordance with a sum of a second current and a third current received via a fourth node; (step 430) establishing a first negative feedback control loop by converting the first current into the third current using a current-controlled current source (CCCS); and (step 440) establishing a second negative feedback control loop by converting a drain voltage at the third node into the second current using a voltage-controlled current source (VCCS).

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An envelope detector comprising:
   a common-mode source follower (CMSF) comprising a first source follower and a second source follower connected in parallel and configured to receive a RF (radio frequency) signal comprising a first voltage at a first node and a second voltage at a second node, respectively, and output a first current to a third node in accordance with a sum of a second current and a third current received via a fourth node;
   a current-controlled current source (CCCS) configured to receive the first current and output the third current; and
   a voltage-controlled current source (VCCS) configured to output the second current in accordance with a bias voltage and a drain voltage at the third node.

2. The envelope detector of claim 1, wherein the CCCS comprises a first PMOSFET (p-channel metal-oxide semiconductor field-effect transistor) configured in a diode-connect topology to convert the first current into the drain voltage and a second PMOSFET configured to output the third current to the fourth node in accordance with the drain voltage, a source of the first PMOSFET and a source of the second PMOSFET being connected to a power supply node.

3. The envelope detector of claim 2, wherein a gate of the first PMOSFET connects to a fifth node that is DC (direct-current) coupled to the third node via a resistor.

4. The envelope detector of claim 3, wherein the CCCS further comprises a capacitor configured to couple the fifth node to the power supply node.

5. The envelope detector of claim 1, wherein the VCCS comprises a NMOSFET (n-channel metal-oxide semiconductor field-effect transistor) configured to output the second current to the fourth node in accordance with a gate voltage at a gate node that is DC (direct current) coupled to the bias voltage via a gate resistor and AC (alternate current) coupled to the drain voltage via a coupling capacitor.

6. The envelope detector of claim 1 further comprising an AC (alternate current) coupling network configured to couple an incoming signal into the RF signal and set a DC (direct current) level of the RF signal to be equal to a common-mode voltage, the incoming signal comprising a third voltage and a fourth voltage.

7. The envelope detector of claim 6, wherein the AC coupling network comprises two capacitors configured to couple the third voltage and the fourth voltage to the first voltage and the second voltage, respectively, and two resistors configured to couple the common-mode voltage to the first voltage and the second voltage, respectively.

8. The envelope detector of claim 6 further comprising a bias generation network configured to receive a reference voltage and output the common-mode voltage in a manner such that a DC level of an output voltage at the fourth node is approximately equal to the reference voltage.

9. The envelope detector of claim 8, wherein the bias generation network comprises an additional CMSF that is a replica of the CMSF, an additional CCCS that is a replica of the CCCS, an additional VCCS that is a replica of the VCCS, and an operational amplifier.

10. The envelope detector of claim 9, wherein the operational amplifier outputs the common-mode voltage in accordance with a difference between a source voltage of the additional CMSF and the reference voltage.

11. A method of envelope detection comprising:
receiving a RF (radio frequency) signal comprising a first voltage at a first node and a second voltage at a second node;
using a common-mode source-follower (CMSF) comprising a first source follower and a second source follower connected in parallel and configured to receive the first voltage and the second voltage, respectively, and jointly output a first current to a third node in accordance with a sum of a second current and a third current received via a fourth node;
establishing a first negative feedback control loop by converting the first current into the third current using a current-controlled current source (CCCS); and
establishing a second negative feedback control loop by converting a drain voltage at the third node into the second current using a voltage controlled current source (VCCS).

12. The method of envelope detection of claim 11, wherein the CCCS comprises a first PMOSFET (p-channel metal-oxide semiconductor field-effect transistor) configured in a diode-connect topology to convert the first current into the drain voltage and a second PMOSFET configured to output the third current to the fourth node in accordance with the drain voltage, a source of the first PMOSFET and a source of the second PMOSFET being connected to a power supply node.

13. The method of envelope detection of claim 12, wherein a gate of the first PMOSFET connects to a fifth node that is DC (direct-current) coupled to the third node via a resistor.

14. The method of envelope detection of claim 13, wherein the CCCS further comprises a capacitor configured to couple the fifth node to the power supply node.

15. The method of envelope detection of claim 11, wherein the VCCS comprises a NMOSFET (p-channel metal-oxide semiconductor field-effect transistor) configured to output the second current to the fourth node in accordance with a gate voltage at a gate node that is DC (direct current) coupled to a bias voltage via a gate resistor and AC (alternate current) coupled to the drain voltage via a coupling capacitor.

16. The method of envelope detection of claim 11 further comprising using an AC (alternate current) coupling network to couple an incoming signal into the RF signal and set a DC (direct current) level of the RF signal to be equal to a common-mode voltage, the incoming signal comprising a third voltage and a fourth voltage.

17. The method of envelope detection of claim 16, wherein the AC coupling network comprises two capacitors configured to couple the third voltage and the fourth voltage to the first voltage and the second voltage, respectively, and two resistors configured to couple the common-mode voltage to the first voltage and the second voltage, respectively.

18. The method of envelope detection of claim 16 further comprising using a bias generation network to receive a reference voltage and output the common-mode voltage in a manner such that a DC level of an output voltage at the fourth node is approximately equal to the reference voltage.

19. The method of envelope detection of claim 18, wherein the bias generation network comprises an additional CMSF that is a replica of the CMSF, an additional CCCS that is a replica of the CCCS, an additional VCCS that is a replica of the VCCS, and an operational amplifier.

20. The method of envelope detection of claim 19, wherein the operational amplifier outputs the common-mode voltage in accordance with a difference between a source voltage of the additional CMSF and the reference voltage.

* * * * *